(12) United States Patent
Wallace et al.

(10) Patent No.: US 10,473,697 B2
(45) Date of Patent: *Nov. 12, 2019

(54) CURRENT TRANSDUCER WITH OFFSET CANCELLATION

(71) Applicant: General Electric Company, Schenectady, NY (US)

(72) Inventors: Daniel Robert Wallace, Atlanta, GA (US); John Michael Kern, Atlanta, GA (US); Richard Young, Atlanta, GA (US); Brian Ross, Atlanta, GA (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 392 days.

This patent is subject to a terminal disclaimer.

(21) Appl. No.: 14/676,423

(22) Filed: Apr. 1, 2015

(65) Prior Publication Data

US 2016/0291064 A1    Oct. 6, 2016

(51) Int. Cl.
*G01R 15/24* (2006.01)
*G01R 19/32* (2006.01)
*G01R 19/25* (2006.01)

(52) U.S. Cl.
CPC ......... *G01R 15/241* (2013.01); *G01R 15/246* (2013.01); *G01R 15/247* (2013.01); *G01R 19/32* (2013.01); *G01R 19/2506* (2013.01)

(58) Field of Classification Search
CPC .. G01R 15/241; G01R 15/246; G01R 15/247; G01R 19/32; G01R 19/2506
USPC .......................................................... 324/96
See application file for complete search history.

(56) References Cited

U.S. PATENT DOCUMENTS

| | | | |
|---|---|---|---|
| 4,755,665 A | 7/1988 | Ulmer, Jr. | |
| 5,656,934 A | 8/1997 | Bosselmann et al. | |
| 5,847,560 A * | 12/1998 | Bosselmann | ........ G01R 15/246 324/117 R |
| 6,114,846 A | 9/2000 | Bosselmann et al. | |
| 6,154,022 A | 11/2000 | Willsch et al. | |
| 7,493,052 B2 | 2/2009 | Blake et al. | |

(Continued)

FOREIGN PATENT DOCUMENTS

| | | |
|---|---|---|
| CN | 102628886 | 8/2012 |
| DE | 19503802 | 11/1996 |

(Continued)

OTHER PUBLICATIONS

Search Report in corresponding European Application No. 16162096.8, dated Aug. 11, 2016.

(Continued)

*Primary Examiner* — Patrick Assouad
*Assistant Examiner* — Haidong Zhang
(74) *Attorney, Agent, or Firm* — Eversheds Sutherland (US) LLP

(57) ABSTRACT

There is provided a system for use with a fiber-optic current transducer. The system includes a processing unit configured to transduce a first light signal into a first electrical signal. The processing unit is further configured to transduce a second light signal into a second electrical signal. Furthermore, the processing unit is configured to remove offsets from the first electrical signal and the second electrical signal by forcing the first electrical signal and the second electrical signal to be on the same per unit basis.

10 Claims, 4 Drawing Sheets

(56) References Cited

U.S. PATENT DOCUMENTS

| | | | |
|---|---|---|---|
| 7,655,900 B2 | 2/2010 | Kurosawa et al. | |
| 2001/0033530 A1* | 10/2001 | Shibuya | G11B 7/0903 |
| | | | 369/44.37 |
| 2004/0246460 A1* | 12/2004 | Auracher | H01S 5/06832 |
| | | | 356/4.01 |
| 2010/0253320 A1 | 10/2010 | Kurosawa | |
| 2016/0291062 A1* | 10/2016 | Wallace | G01R 15/005 |

FOREIGN PATENT DOCUMENTS

| | | |
|---|---|---|
| DE | 19517128 | 11/1996 |
| EP | 2479681 | 7/2012 |
| GB | 2164146 | 3/1986 |
| WO | 2014006121 | 1/2014 |

OTHER PUBLICATIONS

English Abstract of DE19503802.
English Abstract of CN102628886.
English Abstract of DE19517128.

\* cited by examiner

CURRENT TRANSDUCER WITH OFFSET CANCELLATION

I. FIELD OF THE INVENTION

The present disclosure generally relates to current transducers. More particularly, the present disclosure relates to current transducers with offset cancellation.

II. BACKGROUND OF THE INVENTION

High voltage transmission lines require permanent current or voltage monitoring in order to react to faults in a proper manner. Specifically, the ability to quickly and reliably detect current transients is paramount because protection circuits must react in adequate time to mitigate short circuits that can damage equipment located at either end of a transmission line.

In some applications, typically requiring high voltages (>69 kV), current flow (steady state or transient) can be measured using traditional iron core current transformers or using optical current transducers. Iron core transformers include costly ceramic insulators that are used to provide adequate isolation between the transformers' windings. As such, they may not be an economical solution when considering deployment in large electricity distribution networks. Most importantly, however, these transformers have undesired performance characteristics. Namely, they can introduce significant distortions in the measured current signal due to the hysteresis of their iron cores.

Fiber-optic current transducers (FOCTs) have been used as an alternative technology to circumvent the aforementioned issues; FOCTs can be less costly, although for applications with voltages lower than 15 kV, this may not be the case. Nevertheless, FOCTs have superior performance. They operate on the principle of Faraday rotation, which is a magneto-optical effect whereby a rotation of the plane of polarization of a light beam confined in a fiber-optic waveguide placed near the transmission line is observed in response to a magnetic field induced by the flow of current. The rotation angle is linearly proportional to the component of the magnetic field in the direction of propagation of the light, and as such, the change in angle can be correlated with the strength of the magnetic field, which can in turn be used to calculate the current.

A typical reflection-based FOCT measurement sensor includes a module of optical components with three fibers attached thereto. Two of the fibers (data fibers) are connected to a receiver, and the third fiber is a low birefringence fiber (LBF) that is wrapped around the transmission line.

Inside the module, there is a polarizer that polarizes the light at zero degrees. After the light is polarized, it is rotated by 22.5 degrees using a Faraday rotator. From the rotator, the light enters the LBF wherein it is further rotated by the magnetic field induced by the current in the transmission line. At the end of the LBF, there is a mirror that reflects the light back to the rotator, which rotates the light another 22.5 degrees. After the second rotation, the light is broken into two components that are transduced by the receiver into two electrical signals denoted "X" and "Y."

The Faraday rotator may cause significant errors in the X and Y components. These errors are manifested as DC offsets in each of the signals, and they are due to variations in temperature at the crystal that make up the Faraday rotator. As such, these offsets are termed "crystal offsets." Offsets may also arise from losses that occur when light travels through the data fibers. All of these offsets can introduce significant errors in estimating the current in the transmission line.

III. SUMMARY

FOCTs configured according to embodiments of the present disclosure have several advantages that help mitigate several shortcomings known in the relevant art(s). For example, embodiments of the present disclosure allow offsets to be removed from the measured signal and thus provide a more accurate output than what is possible with conventional FOCTs. Furthermore, FOCTs configured according to the teachings featured herein have the advantage of removing non-symmetrical features in the measured current waveform, thus making it possible to provide accurate information when processing the current using Fourier Transform techniques, for example. These advantages, and others that will be readily apparent to one of skill in the relevant art(s), are provided by the novel embodiments disclosed herein.

In one embodiment, the present disclosure features a system for use with a fiber-optic current transducer. The system includes a processing unit configured to transduce a first light signal into a first electrical signal. The processing unit is also configured to transduce a second light signal into a second electrical signal. Furthermore, the processing unit is configured to remove offsets from the first electrical signal and the second electrical signal by forcing the first electrical signal and the second electrical signal to be on the same per unit basis.

In another embodiment, the present disclosure provides a system for use with a fiber-optic current transducer. The system includes a processing unit configured to transduce a first light signal into a first electrical signal and a second light signal into a second electrical signal. The processing unit can include regulation circuitry configured to normalize the first electrical signal and the second electrical and to remove offsets in the first electrical signal and the second electrical upon normalization.

Yet in another embodiment, the present disclosure features a method that includes adjusting, by a system, a first electrical signal and a second electrical signal until both electrical signals are on the same per unit basis. The method further includes removing, by the system, offsets present in each of the adjusted first electrical signal and second electrical signal.

Additional features and advantages, as well as the structure and operation of various embodiments, are described in detail below with reference to the accompanying drawings. It is noted that the disclosure is not limited to the specific embodiments described herein. Such embodiments are presented herein for illustrative purposes only. Additional embodiments will be apparent to persons skilled in the relevant art(s) based on the teachings contained herein.

IV. BRIEF DESCRIPTION OF THE DRAWINGS

Illustrative embodiments may take form in various components and arrangements of components. Illustrative embodiments are shown in the accompanying drawings, throughout which like reference numerals may indicate corresponding or similar parts in the various figures. The drawings are only for purposes of illustrating embodiments and are not to be construed as limiting the disclosure. Given the following enabling description of the drawings, the novel aspects of the present disclosure should become evident to a person of ordinary skill in the art.

V. DETAILED DESCRIPTION OF EMBODIMENTS OF THE PRESENT INVENTION

While illustrative embodiments are described herein for particular applications, it should be understood that the present disclosure is not limited thereto. Those skilled in the art with access to the teachings provided herein will recognize additional modifications, applications, and embodiments within the scope thereof and additional fields in which the present disclosure would be of significant utility.

Figure 1:
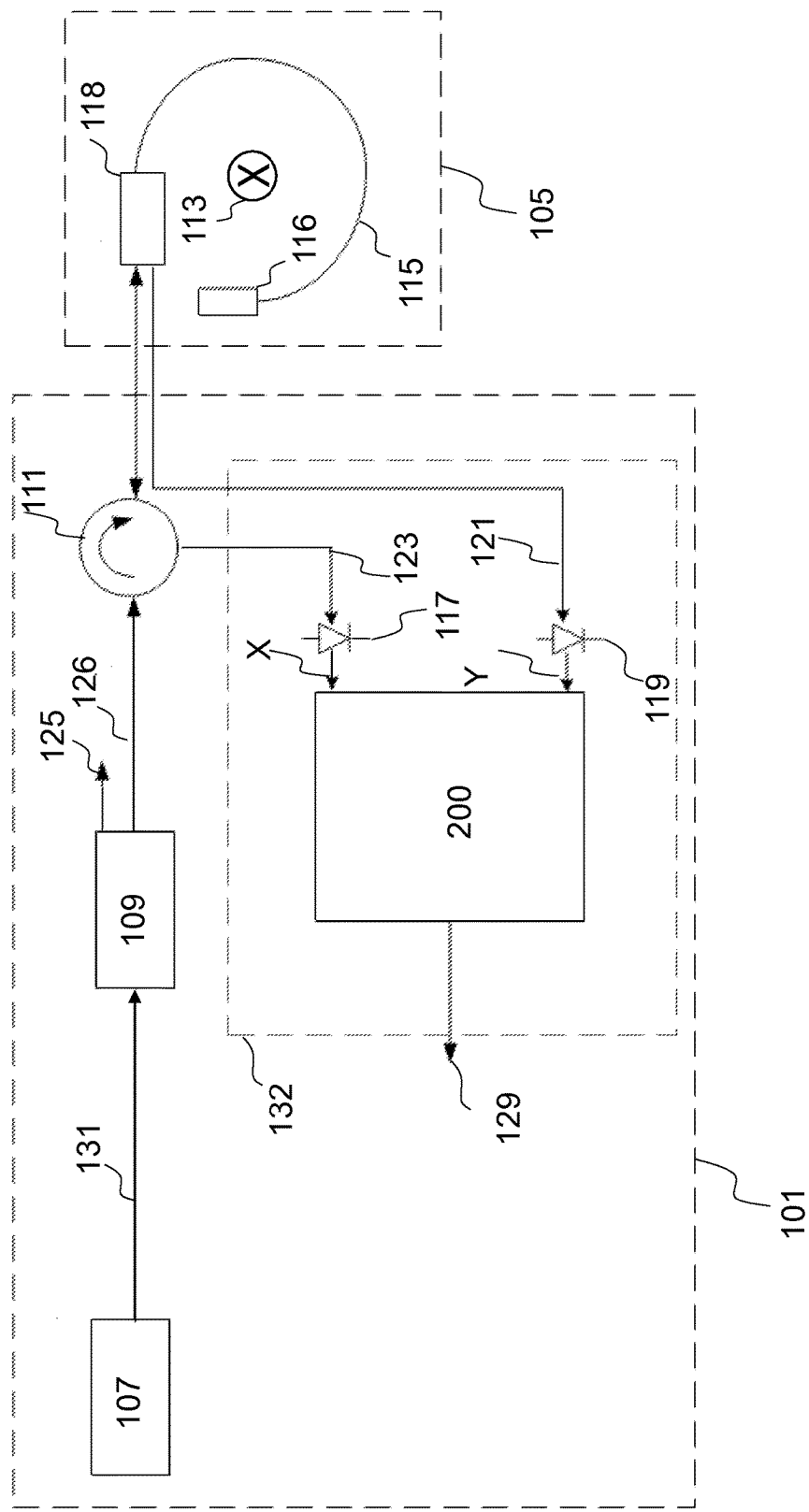
FIG. 1 is an illustration of a fiber-optic current transducer system configuration, according to an exemplary embodiment.

FIG. 1 is an illustration of a fiber-optic current transducer system 100 according to an exemplary embodiment. The FOCT includes a sensor module 105 and a receiver module 101. The sensor module 105 includes a fiber 115 positioned around conductor 113. The receiver module 101 includes a light source 107 that produces a non-polarized light beam 131 for input to an optical splitter 109. The optical splitter 109 is configured to split the light beam 131 into multiple outputs, of which only two are shown (125 and 126).

Output 126 is fed to an optical circulator 111 that allows light to enter a first port (P1) and to exit through a second port (P2). Light returning to the second port (P2) of optical circulator 111 is directed to a third port (P3) of optical splitter 109 of the fiber optic sensor 105 via optical module 118. Light beam 131 is coupled to fiber 115 and serves as a probe light beam that changes polarization when current flows in conductor 113. The light in fiber 115 is reflected back into the fiber using an end mirror 116 and back to the receiver 101 via path 123 and path 121. Paths 123 and 121 can be implemented using optical fibers or numerous other wave guiding devices known in the art.

As stated above, the light in fiber 115 is reflected back to receiver 101. A processing unit 132 included in receiver 101 is configured to process the reflected light to provide (at terminal 129) a measure of the current in conductor 113. Processing unit 132 includes transducers 117 and 119. These transducers are configured to convert the light beams from path 123 and path 121 into electrical signals X and Y, respectively.

Transducers 117 and 119 can be implemented using PIN diodes. By way of example, and not by limitation, each PIN diode may have a responsivity in the range of about 0.1 [Amperes/Watt] ([A/W]) to about 1 [A/W]. The transducers can also be implemented using other types of photodetector configurations. For example, p-n junctions, photogates, active or passive pixel sensors can be used to implement each of transducer 117 and 119. In general, any phototransducer can be used without departing from the scope contemplated in the present disclosure.

Processing unit 132 includes a system 200 configured to process electrical signals X and Y to produce an output signal at terminal 129, the output signal being indicative of the current in conductor 113. It is noted that the signal at terminal 129, representative of the current in conductor 113, can be a digital value or an analog output, which may be obtained from a digital-to-analog converter. While only terminal 129 is shown in FIG. 1 as an output of processing unit 132 (and of system 200), other output terminals may be present. Furthermore, while transducers 117 and 119 are shown to be separate from system 200, in some implementations, these transducers can be part of system 200.

Figure 2:
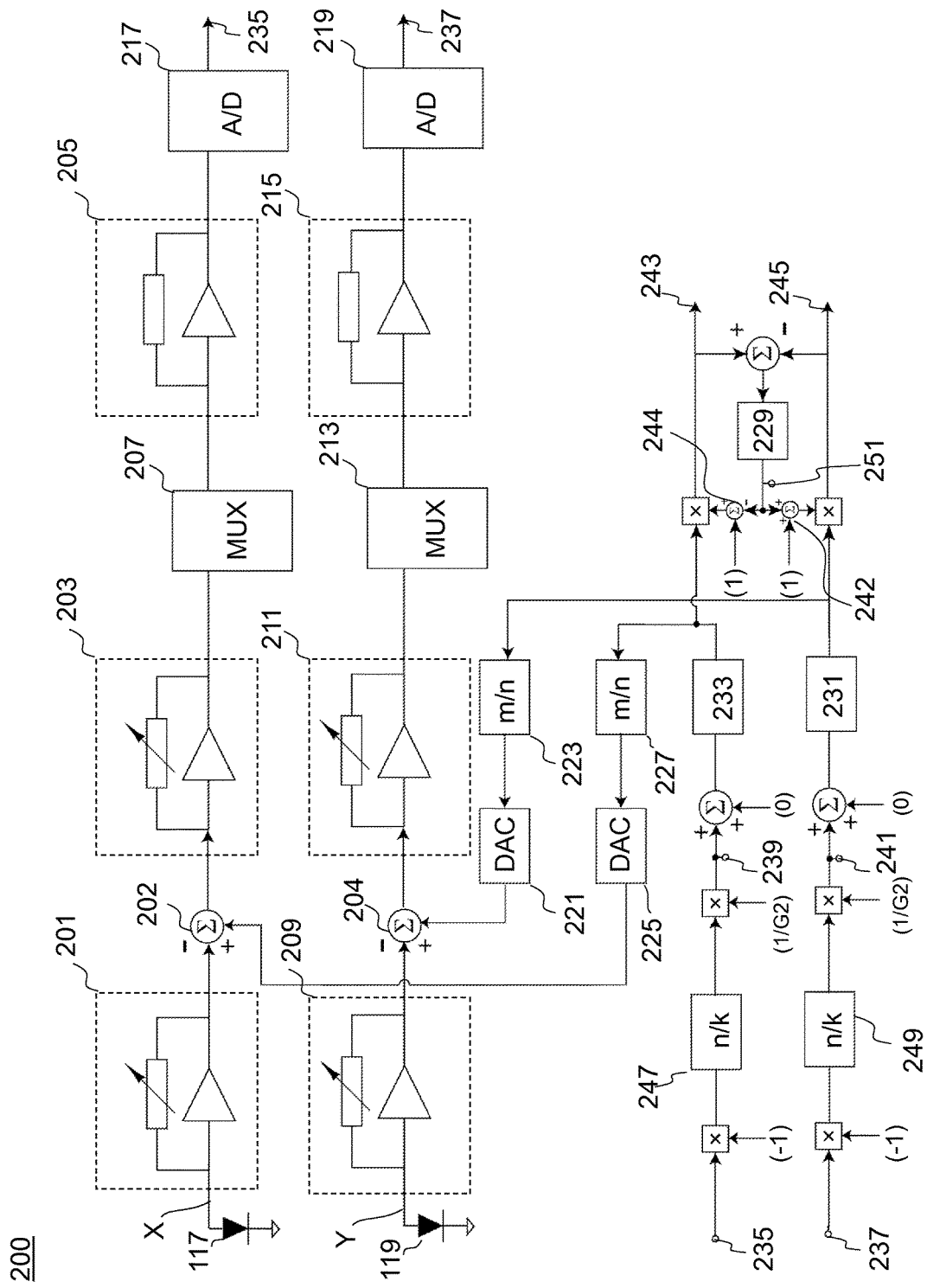
FIG. 2 is an illustration of a system, according to an exemplary embodiment.

FIG. 2 is an illustration of system 200, as discussed above with respect to FIG. 1. It is noted that system 200 can be implemented using discrete integrated circuits such as analog-to-digital (A/D) converters, digital-to-analog (DAC) converters, multiplexers (MUX), amplifiers, integral regulators, push-pull regulators, summing junctions, and the like. System 200 can also be implemented using one or more programmable embedded systems (see FIG. 3). The one or more embedded systems can provide the functionalities that will be discussed below with respect to system 200 and FIG. 2.

System 200 functions as a decoder, in that it decodes information contained in electrical signals X and Y. (It is noted that while system 200 is configured to yield a value of the current in conductor 113 at terminal 129, this aspect is not discussed herein but in concurrently-filed U.S. patent Appl. No. The X and Y signals are representative of the light beams reflected to receiver 101 from fiber 115. System 200 can include a processor (not shown) and a memory (not shown). The processor can be programmed to execute instructions from the memory to control the various components of system 200 shown in FIG. 2. For example, the processor can be programmed to select the gain of the various gain stages of system 200. Signal values can also be stored in the memory to allow further processing and/or data logging. The memory can be co-located with the processor and the other components of system 200.

At power up, system 200 undergoes an initialization and calibration process wherein inherent offsets of DAC modules and A/D modules are cancelled. During initialization and calibration, the gain of gain stage 201 is set to 1 (or to zero, considering the small current input signal), considering that gain during operation is greater than 10,000. The inherent offset in DAC 221 is determined by taking data at two different gains using gain stage 203. This inherent offset is then removed by offsetting the output of DAC 221 and it is added to any signal inputted to DAC 221. After calibrating DAC 221, the offset of A/D 217 is calculated and stored in the memory. A similar procedure is undertaken using gain stages 209 and 211, DAC 225 and A/D 219.

System 200 includes two signal paths, each reserved for one of electrical signal X and electrical signal Y. Each of these signal paths forms a channel. The path for electrical signal X (hereafter the "X-signal path," or the "X-channel") includes a first gain stage 201 that buffers signals X. Gain stage 201 can be programmed to amplify electrical signal X. When signal X is a current (i.e. a photocurrent in transducer 117), gain stage 201 converts electrical signals X into a voltage signal.

Gain stage 201 is a variable gain stage. During operation of system 200, the processor steps through several gain values supported by gain stage 201 until the output of gain stage 201 reaches an optimum value. For example, the optimum value may correspond to the output of gain stage 201 reaching a voltage that is in the range of about 4 Volts to about 6 Volts. The optimum value can also be a predetermined target voltage and the processor may stop stepping through the gain values of gain stage 201 when the output voltage is within a tolerance of the predetermined target voltage.

The integral regulator 233 forces the output of summing junction 202 to be zero. Thus, the output of integral regulator 233 represents the DC offset contained in electrical signal X. By forcing the output of summing junction 202 to zero, the gain of gain stage 203 (which is also a variable gain stage) can be large without saturating A/D 217.

Similarly, in the path for electrical signal Y (i.e. the "Y-signal path," or the "Y-channel"), there is a gain stage 209 that is a variable gain stage. The processor steps through several gain values supported by gain stage 209 until the output of gain stage 209 reaches an optimum value. As before, the optimum value may correspond to the output of gain stage 209 reaching a voltage that is in the range of about 4 Volts to about 6 Volts. The optimum value can also be a predetermined target voltage and the processor may stop stepping through the gain values of gain stage 209 when the output voltage is within a tolerance of the predetermined target voltage.

The integral regulator 231 forces the output of summing junction 204 to be zero. Thus, the output of integral regulator 233 represents the DC offset contained in electrical signal Y. By forcing the output of summing junction 204 to zero, the gain of gain stage 211 (which is also a variable gain stage) can be large without saturating A/D 219.

System 200 also includes a MUX 207 in the X-signal path. MUX 207 multiplexes several X-channels into driver 205, which drives A/D 217. Inputs of MUX 207 can also include power supply data which can serve to force the output of driver 205 to a power supply rail. In some implementations, MUX 207 can be a 16-to-1 multiplexer.

The output 235 of A/D 217 is fed to the input path of integral regulator 233. A/D 217 can be an 18-bit converter. It is noted that A/D configurations such as flash or sigma-delta or any other A/D architecture can be used without departing from the scope of the present disclosure. Furthermore, Y-signal path includes components similar in architecture and function to the above-mentioned components of the X-signal path. For example, the Y-signal path includes a MUX 213, which can also be used to interface system 200 with multiple Y-signal paths originating from a plurality of FOCTs. Driver 215 drives A/D 219, much like driver 205 drivers A/D 217. The Output 237 of A/D 219 is fed to the input path of integral regulator 231 for further processing.

System 200 also includes several components in the input path of the integral regulators 233 and 231. For example, the output signal 235 is scaled by a factor of "−1" and by a factor of "1/G2" before being fed to a summing junction at the input of integral regulator 233. The scaling factor of "−1" is used because A/D drivers 205 and 215 are inverting operational amplifiers. In another embodiment, non-inverting amplifiers can be used to implement drivers 205 and 215, in which the proper scaling factor would be "+1."

The two scaling factors effectively scale the signal of output 235 to provide signal 239, which represents the raw X-signal but in a digital format. Similarly, in the input path of integral regulator 231, output signal 237 is scaled by a factor of "−1" and by a factor of "1/G2" to provide signal 241, which represents the raw Y-signal, which is also in digital format. It is noted that G2 is the gain of stage 203 or that of stage 211. During operation, both stages have identical gains. However, generally speaking, gain stages 203 and 211 do not need to have the same gain, as these gains can be cancelled by adjusting the signal in each path with the reciprocal value of its corresponding gain. Such adjustments mean that outputs 239 and 241 are in engineering units. It is noted that other unit systems can be used without departing from the scope of the present disclosure.

The "n/k" ratio in blocks 247 and 249 in each of the input paths of integral regulators 233 and 231 represent the voltage resolution at which the signal can be observed on each of the input paths. This voltage resolution is governed by the number of quantization levels of A/D 217 and A/D 219. For instance, in blocks 247 and 249, "n" can be 10, indicating a maximum voltage swing of 10 Volts, and "k" can be 131,071, representing the number of quantization levels of 18-bit A/D 217 and A/D 219. It is noted that 10 V corresponds to 131,071 and −10V corresponds −131,071, thereby allowing bipolar operation. Furthermore, it is noted that these values of "n" and "k" are exemplary; they can be changed without departing from the scope of the present disclosure.

System 200 also includes DAC 221 and 225, which convert the outputs of integral regulators 233 and 231 to analog signals before input to summing junctions 204 and 202. The ratios "min" in blocks 227 and 223 merely indicate resolution of the digital-to-analog conversion. For example, "m" can be 32,767, presenting the number of analog levels of either of DAC 221 and DAC 225, and "n" can be 10, indicating a maximum voltage of 10 Volts.

During operation of system 200, the nominal power returned on the Y-signal path is different than the nominal power returned on the X-signal path since different losses can occur in each of the channels. These losses correspond to a gain of less than 1. As such, push-pull regulator 229 is configured to adjust the gain in both the X-signal path and the Y-signal path to force each of electrical signal X and electrical signal Y to be on the same per-unit ("pu") basis. This occurs via the summing junctions 242 and 244 and by scaling the outputs of integral regulators 233 and 231. This compensates for losses due to temperature variations, crystal offsets and various optical components losses.

Once push-pull regulator 229 has corrected the gain, electrical signal Y can then be subtracted from the electrical signal X, and any DC component will be eliminated. Signals 243 and 245 correspond respectively to the DC offset in electrical signal X and electrical signal Y, respectively. These signals have been normalized and are on the same per unit base and have essentially the same value. Push-pull regulator 229 ensures that offset removal can still be performed when there is a sudden change in the output power of light source 107 because signals X and Y are on the same per unit base. Specifically, a sudden change in light power would be the same on both the X and Y signals at 243 and 245. This is important since, in some implementations, integral regulators 233 and 231 may be relatively slow in forcing the outputs of summing junctions 202 and 204 to zero. Thus, as a result of the operation of push-pull regulator 229, any AC component that would appear in the measured current due to distortions will be removed. This AC component is the non-symmetrical component in the X or Y signals resulting from integrating the sine of a sine wave, as is done in each of the signal paths. Such operation produces an egg-shaped signal, which is more prominent at high current values.

Furthermore, system 200 has several advantages over typical analog FOCTs. For example, system 200 provides more noise immunity than the typical analog FOCTs. Noise may arise from vibrations that disturb fiber 115. When this happens, the light in the fiber is not perfectly polarized. In some embodiments, this may not matter as long as a single mode (SM) fiber used between sensor 105 and the polarizer remains stable. Yet in other embodiments, a polarization-maintaining (PM) fiber can be used between sensor 105 and the polarizer to circumvent the noise issues. A PM fiber can be 6 to 10 times more stable than the SM fiber.

However, generally speaking, any previously polarized light causes the light power to increase or decrease depending on whether it matches the angle the sensor is attempting to polarize the light at. If the SM fiber is moved or caused to vibrate, the polarized light angle is shifted and is perceived as noise at the receiver/decoder. Typical analog FOCTs cannot remove the noise, and this vibrational noise is output as noise in the current signal. However, in FOCTs configured based on the teachings of the present disclosure, no so such noise is superimposed on the current signal. This is accomplished by push-pull regulator 229, which forces the X and Y signal to be on the same per unit base. By doing so, the noise is in phase in both the X and Y signals, and the noise is removed when the X and Y signals are subtracted to compute the measured current.

System 200 can be configured to provide accurate current measurements in a low current regime and in a high current regime. For instance, when the X and Y signals are added to obtain the measured current, their AC component is cancelled and only the DC component remains. This occurs when the current in conductor 113 is in the low current regime, i.e. below approximately 4,000 A (rms).

In the high current regime (i.e. for a current in conductor 113 that is greater than 4,000 A (rms)), the area of the negative section of the AC waveform in the measured current is greater than the area of in its positive section. The difference between these two areas grows with larger currents. As such, during large current measurements, the DC signal will be dominated by the negative portion of the current, and will have a fundamental frequency twice that of the waveform in the negative section.

Thus, if the DC signal is low pass filtered, the output will decay with large current measurements. This decay corresponds to a perceived decrease in steady state light power. System 200 can be configured to detect a maximum value in each cycle required to capture the true power value of the light source. This occurs using the ratio of the maximum value to the perceived power value as a current correction factor. This eliminates the non-linear error to 1 pu current, which relates to a 45 degree phase shift in the light from the zero current steady state value.

Figure 3:
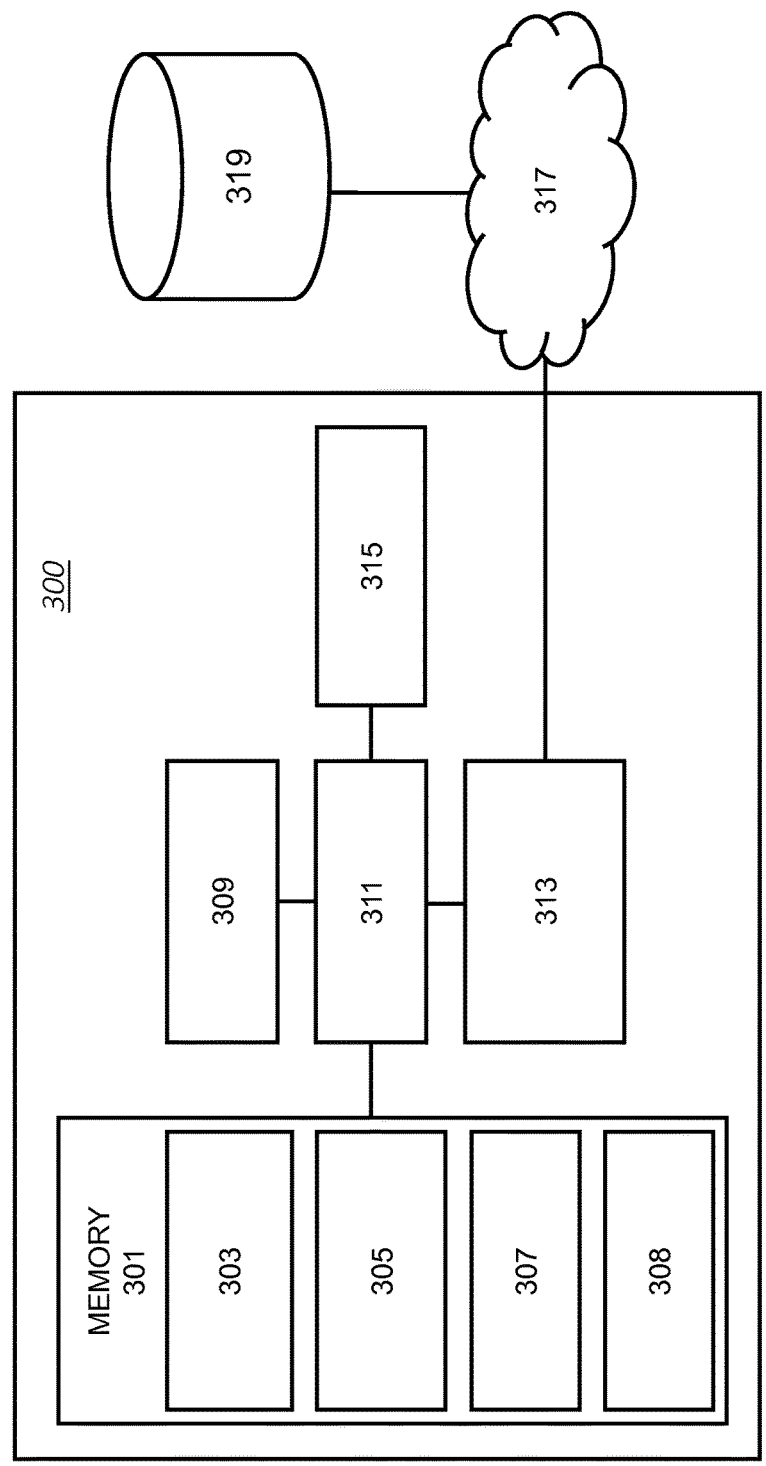
FIG. 3 is an illustration of another system, according to an exemplary embodiment.

FIG. 3 is an illustration of system 300 according to an embodiment. System 300 can perform all the functions described above with respect to system 200. Furthermore, system 300 is an application-specific system implemented using programmable hardware. The functions of system 300 can be programmed in software and/or firmware that can be loaded onto a computer-readable medium which can be read by system 300 to cause system 300 to execute one or more of the functions.

System 300 can be implemented using at least one of a system-on-a-chip (SoC), an embedded computer, and a microcontroller. System 300 can include a processing unit coupled to a memory device. The memory can have instructions stored thereon, the instructions being configured to cause the processing unit to execute the various functions described above with respect to system 200.

System 300 can include one or more hardware and/or software (or firmware) components configured to fetch, decode, execute, store, analyze, distribute, evaluate, and/or categorize information relating to the various functions and applications discussed herein. In some embodiments, the entirety of system 300 may be located proximate to the transmission line (i.e. conductor 113 in FIG. 1). In other embodiments, some components of system 300 may be located distant from the transmission line, i.e. away from the measurement site.

System 300 can include one or more processing unit 311, a storage device 315, a memory 301, an input/output (I/O) module 309, and a communication network interface 313. System 300 can be connected to a communication network 317 via network interface 313. As such, system 300 can be communicatively coupled to a database 319. While FIG. 3 illustrates only one database (database 319), one of ordinary skill in the relevant art(s) will readily recognize that system 300 may be communicatively coupled to several databases.

System 300 can configured to interface with a protective relay using a communication protocol. For example, and not by limitation, system 300 can be connected to the protective relay using the process bus standard IEC 61850. System 300 can be configured to function as a client device that is communicatively coupled to a server (not shown) via network 317. The server may be located at one data center, or distributed over a plurality of data centers. In some embodiments, I/O module 309 includes a keypad (not shown) for user input I/O module 309 includes a serial interface, or I/O module 309 can be a web server communicatively coupled with system 300 via network 317. In other embodiments, I/O module 309 can include a touchscreen interface for input and one or more displays for visual output, such as a view screen.

Processing unit 311 can include one or more processing devices or cores (not shown). Further, as shown in FIG. 3, processing unit 311 can be communicatively coupled to storage device 315, memory 301, I/O module 309, and network interface 313. As such, processing unit 311 may be configured to execute software or firmware instructions, routines, or sub-routines that are designed to cause processing unit 311 to perform a variety of functions and/or operations consistent with the embodiments of the present disclosure. In one exemplary embodiment, instructions can be loaded into the various modules of memory 301 for execution by processing unit 311. Instructions can also be fetched by processing unit 311 from database 319, storage device 315, or they may be provided to processing unit 311 from I/O module 309.

Storage device 315 can include a volatile or non-volatile, magnetic, semiconductor, tape, optical, removable, non-removable, read-only, random-access, or other type of storage device or computer-readable computer medium. Furthermore, storage 315 can be configured to log data processed, recorded, or collected during the operation of system 300. The data can be time-stamped, cataloged, indexed, or organized in a variety of ways consistent with data storage practice without departing from the scope of the present disclosure.

Communication network interface 313 includes one or more components configured to transmit and receive data via communication network 317. These components can include one or more modulators, demodulators, multiplexers, de-multiplexers, network communication devices, wireless devices, antennas, modems, and any other type of device configured to enable data communication via any suitable communication network. Furthermore, communication network 317 can be any appropriate network allowing communication between or among one or more computing systems, such as the Internet, a local area network, or a wide area network.

Memory 301 can include an initialization and calibration module 303 configured to cause processing unit 311 to initialize and calibrate system 300, as described above with respect to system 200. Further, memory 301 can include an X-offset removal module 305 configured to cause processing unit 311 to receive an electrical signal X from one transducer (not shown) and to remove an offset from the electrical signal X. Furthermore, memory 301 can include a Y-offset removal module 307 configured to cause processing unit 311 to receive an electrical signal Y from another transducer (not shown) and to remove an offset from the electrical signal Y.

Memory 301 can also include a normalizing module 308 configured to normalize electrical signal Y and electrical signal X, wherein normalization includes making electrical signal X and electrical signal Y to be on the same per unit basis. In sum, while only a few modules are described in relation to memory 301, it should be understood that all of the functions of system 200 can be implemented in the form of modules of memory 301.

Having set forth the structure and function of system 200 and the various modules included in exemplary system 200, operations consistent with embodiments of the present disclosure are now described. Such operations can include executing a method of removing a DC offset using the exemplary systems previously described.

Figure 4:
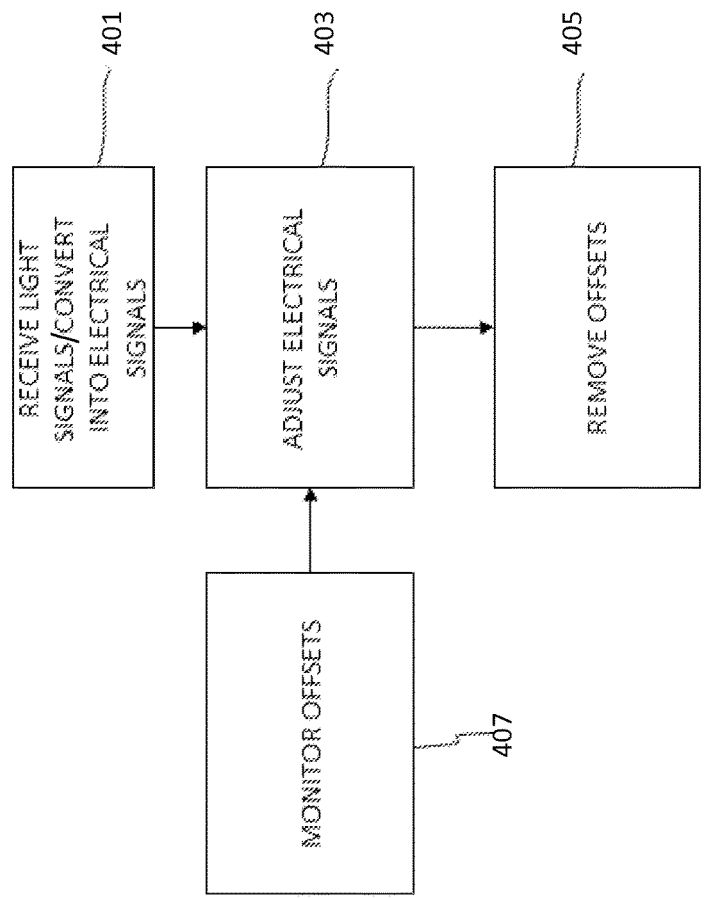
FIG. 4 is a flow chart depicting a method for removing offsets, according to an exemplary embodiment.

FIG. 4 is a flow chart illustrating a method 400, according to an embodiment. Method 400 can be executed using the exemplary systems described above. Further, it may be used to remove offsets in electrical signals as well adjusting one or more electrical signals to be on the same per unit basis. It is noted that while method 400 is discussed in the context of electrical signals transduced from FOCT light signals, method 400 is not limited to only such applications. Specifically, method 400 can be used for any application in which offset removal and signal normalizing is required.

Method 400 includes receiving, by a system like the ones disclosed herein, a first light signal. Further, method 400 includes transducing the first light signal into a first electrical signal, which can be the X-signal, as described above (step 401). Method 400 also includes receiving a second light signal and transducing the second light signal into a second electrical signal, which can be the Y-signal, as described above (step 401).

Method 400 then includes adjusting the first electrical signal and the second electrical signal until both electrical signals are on the same per unit basis (403). Furthermore, method 400 can also include removing offsets present in each of the adjusted first electrical signal and second electrical signal (step 405).

In some embodiments, method 400 can include monitoring a difference in DC offsets between the first electrical signal and the second electrical signal (407). Moreover, as a result of monitoring the DC offsets, method 400 can include altering the first electrical signal and the second electrical signal until both signals are equal. Adjusting the electrical signals may include altering the first electrical signal and the second electrical signal by providing a gain to multiply each of the signals until both are equal. Furthermore, adjusting the signals can include normalizing the first electrical signal and the second electrical.

Those skilled in the relevant art(s) will appreciate that various adaptations and modifications of the embodiments described above can be configured without departing from the scope and spirit of the disclosure. Therefore, it is to be understood that, within the scope of the appended claims, the disclosure may be practiced other than as specifically described herein.

What is claimed is:

1. A system, for use with a fiber-optic current transducer (FOCT), the system comprising:
    a processing unit configured to:
        convert a first light signal into a first electrical signal;
        convert a second light signal into a second electrical signal;
        calculate a first direct current (DC) offset of the first electrical signal;
        calculate a second direct current (DC) offset of the second electrical signal;
        calculate a difference value by subtracting the first DC offset of the first electrical signal from the second DC offset of the second electrical signal;
        calculate, based on the difference value, a first gain for the first electrical signal and a second gain for the second electrical signal;
        calculate a first adjusted DC offset by multiplying the first DC offset by the first gain;
        calculate a second adjusted DC offset by multiplying the second DC offset by the second gain;
        wherein the first gain and the second gain are determined such that the first adjusted DC offset is equal to the second adjusted DC offset;
        calculate a first adjusted electrical signal by multiplying the first electrical signal by the by the first gain; and
        calculate a second adjusted electrical signal by multiplying the second electrical signal by the second gain.

2. The system of claim 1, further comprising a crystal that is configured to route the first light signal and the second light signal.

3. The system of claim 1, wherein the first DC offset is calculated by integrating the first electrical signal with an integrator and the second DC offset is calculated by integrating the second electrical signal with the integrator.

4. The system of claim 3, wherein the first DC offset is provided to a first summing junction to remove the first DC offset from the first electrical signal and the second DC offset is provided to a second summing junction to remove the second DC offset from the second electrical signal.

5. The system of claim 1, wherein the first light signal and the second light signal are provided by light in a fiber that is reflected via a first path and a second path.

6. The system of claim 5, wherein the fiber is positioned around a conductor.

7. The system of claim 1, wherein the processing unit is configured to:
    calculate a first removed adjusted signal by subtracting the first adjusted DC offset from the first adjusted electrical signal; and
    calculate a second removed adjusted signal by subtracting the second adjusted DC offset from the second adjusted electrical signal.

8. The system of claim 7, wherein the processing unit is configured to calculate a measured current signal by subtracting the first removed adjusted signal from the second removed adjusted signal.

9. The system of claim 1, wherein the processing unit is configured to calculate a measured current signal by subtracting the first adjusted electrical signal from the second adjusted electrical signal.

10. The system of claim 1, wherein the processing unit is configured to calculate a measured current signal by adding the first adjusted electrical signal to the second adjusted electrical signal.

* * * * *